United States Patent
Zhou

(10) Patent No.: US 10,484,627 B2
(45) Date of Patent: Nov. 19, 2019

(54) IMAGE SENSOR WITH IMPROVED MICRO-LENS, RELATED IMAGING METHOD AND ELECTRONIC DEVICE

(71) Applicant: GUANGDONG OPPO MOBILE TELECOMMUNICATIONS CORP., LTD., Dongguan, Guangdong (CN)

(72) Inventor: Qiqun Zhou, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 23 days.

(21) Appl. No.: 15/893,475

(22) Filed: Feb. 9, 2018

(65) Prior Publication Data
US 2018/0316878 A1 Nov. 1, 2018

(30) Foreign Application Priority Data
Apr. 28, 2017 (CN) .......................... 2017 1 0297653

(51) Int. Cl.
*H04N 5/353* (2011.01)
*H01L 27/146* (2006.01)
(Continued)

(52) U.S. Cl.
CPC ..... *H04N 5/3537* (2013.01); *H01L 27/14607* (2013.01); *H01L 27/14621* (2013.01);
(Continued)

(58) Field of Classification Search
CPC .. H04N 5/3537; H04N 5/3696; H04N 5/2351; H04N 5/23245; H04N 5/23212;
(Continued)

(56) References Cited

U.S. PATENT DOCUMENTS

| 7,924,342 B2 * | 4/2011 | Kusaka | ................ | H04N 5/3696 348/208.12 |
| 9,372,286 B2 * | 6/2016 | Li | .......................... | B05D 1/005 |

(Continued)

FOREIGN PATENT DOCUMENTS

| CN | 1501507 A | 6/2004 |
| CN | 101105543 A | 1/2008 |

(Continued)

OTHER PUBLICATIONS

Taiwan Patent Application No. 107100949,Office Action dated Aug. 17, 2018, 6 pages.
(Continued)

*Primary Examiner* — Luong T Nguyen
(74) *Attorney, Agent, or Firm* — Lathrop Gage LLP

(57) ABSTRACT

The present disclosure discloses an image sensor, an imaging method, an imaging device and an electronic device. The image sensor includes an array of photosensitive units, an array of filter units and an array of micro lenses, in which the array of photosensitive units includes focusing photosensitive units and non-focusing photosensitive units. With the image sensor, when a current ambient luminous intensity is smaller than a preset intensity, the image sensor generates an image with the first output mode, and when the current ambient luminous intensity is greater than the preset intensity, the image sensor generates an image with the second output mode. In addition, when the image sensor is used to focus, phase focusing may be performed according to output values of two parts of photosensitive pixels.

18 Claims, 12 Drawing Sheets

(51) Int. Cl.
  *H04N 5/369* (2011.01)
  *H04N 5/232* (2006.01)
  *H04N 5/235* (2006.01)
  *H04N 9/04* (2006.01)

(52) U.S. Cl.
  CPC ..... *H01L 27/14627* (2013.01); *H04N 5/2351* (2013.01); *H04N 5/23212* (2013.01); *H04N 5/23245* (2013.01); *H04N 5/3696* (2013.01); *H04N 9/045* (2013.01)

(58) Field of Classification Search
  CPC .............. H04N 9/045; H01L 27/14627; H01L 27/14607; H01L 27/14621
  See application file for complete search history.

(56) References Cited

U.S. PATENT DOCUMENTS

| | | | |
|---|---|---|---|
| 2016/0021320 A1* | 1/2016 | Pyeoun | H04N 5/369 348/302 |
| 2016/0037103 A1* | 2/2016 | Seo | H04N 5/23212 348/302 |
| 2016/0277658 A1 | 9/2016 | Kim et al. | |
| 2016/0307941 A1 | 10/2016 | Cheng et al. | |
| 2017/0094210 A1* | 3/2017 | Galor Gluskin | H04N 5/3696 |
| 2017/0099449 A1 | 4/2017 | Kang et al. | |

FOREIGN PATENT DOCUMENTS

| | | |
|---|---|---|
| CN | 102625034 A | 8/2012 |
| CN | 103531603 A | 1/2014 |
| CN | 104064577 A | 9/2014 |
| CN | 104241310 A | 12/2014 |
| CN | 105611122 A | 5/2016 |
| CN | 106549025 A | 3/2017 |
| CN | 106982329 A | 7/2017 |
| CN | 107040702 A | 8/2017 |
| CN | 107040724 A | 8/2017 |
| CN | 107105141 A | 8/2017 |
| CN | 107135340 A | 9/2017 |
| EP | 1936955 A2 | 6/2008 |
| TW | 201605236 A | 2/2016 |
| WO | WO 2017052893 A1 | 3/2017 |

OTHER PUBLICATIONS

PCT/CN2018/081781 English translation of International Search Report and Written Opinion dated Jun. 15, 2018, 11 pages.
European Patent Application No. 18163006.2 extended Search and Opinion dated Sep. 24, 2018, 8 pages.
Chinese Patent Application No. 201710297653.4 English translation of Office Action dated Mar. 5, 2019, 13 pages.
Chinese Patent Application No. 201710297653.4 Office Action dated Mar. 5, 2019, 11 pages.

* cited by examiner imaging mode

IMAGE SENSOR WITH IMPROVED MICRO-LENS, RELATED IMAGING METHOD AND ELECTRONIC DEVICE

FIELD

The present disclosure relates to an electronic technology field, and more particularly to an image sensor, an imaging method and an electronic device.

BACKGROUND

With continuous update of technology, more and more manufacturers begin to employ an image sensor with a 16M-4M structure. When the image sensor outputs an image through a 4M mode under a dark condition, it can improve a signal-noise ratio and noise performance. However, in the dark condition, the 4M mode has a poor focusing speed.

SUMMARY

Embodiments of the present disclosure provide an imaging method. The image sensor includes an array of photosensitive units, an array of filter units arranged on the array of photosensitive units and an array of micro lenses arranged on the array of filter units. The array of photosensitive units includes focusing photosensitive units and non-focusing photosensitive units. The image sensor has a first output mode and a second output mode. The method includes: detecting a current ambient luminous intensity; when the current ambient luminous intensity is smaller than a preset intensity, controlling the image sensor to enter the first output mode; under the first output mode, controlling the array of photosensitive units to enter a focusing mode; obtaining output values of a part of photosensitive pixels in each focusing photosensitive unit as first output values; obtaining output values of another part of photosensitive pixels in each focusing photosensitive unit as second output values; performing focusing control according to the first output values and the second output values; under the first output mode, controlling the array of photosensitive units to enter an imaging mode; and controlling the array of photosensitive units to expose to generate an image under the first output mode.

Embodiments of the present disclosure provide an image sensor. The image sensor includes an array of photosensitive units, an array of filter units arranged on the array of photosensitive units and an array of micro lenses arranged on the array of filter units. The array of photosensitive units includes focusing photosensitive units and non-focusing photosensitive units.

Embodiments of the present disclosure provide an electronic device. The electronic device includes an image sensor, a detecting module and a control module. The image sensor includes: an array of photosensitive units; an array of filter units, arranged on the array of photosensitive units; and an array of micro lenses, arranged on the array of filter units, in which, the array of photosensitive units includes focusing photosensitive units and non-focusing photosensitive units. The detecting module is configured to detect a current ambient luminous intensity. The control module is configured to: control the image sensor to enter the first output mode when the current ambient luminous intensity is smaller than a preset intensity; control, under the first output mode, the array of photosensitive units to enter a focusing mode; obtain output values of a part of photosensitive pixels in each focusing photosensitive unit as first output values; obtain output values of another part of photosensitive pixels in each focusing photosensitive unit as second output values; perform focusing control according to the first output values and the second output values; control, under the first output mode, the array of photosensitive units to enter an imaging mode; and control the array of photosensitive units to expose to generate an image under the first output mode.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings.

EMBODIMENTS OF THE PRESENT DISCLOSURE

Figure 1:
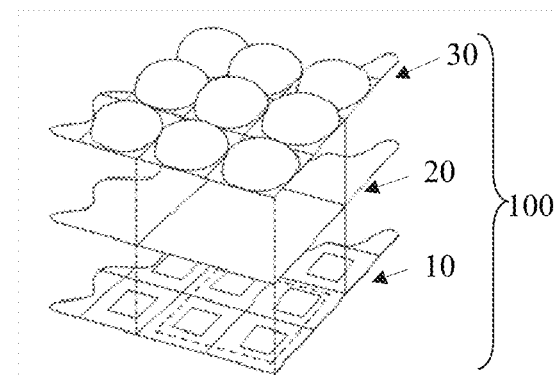
FIG. 1 is a schematic diagram illustrating a three-dimensional structure of an image sensor according to an embodiment of the present disclosure.

Reference will now be made in detail to exemplary embodiments, examples of which are illustrated in the accompanying drawings, in which the same or similar reference numbers throughout the drawings represent the same or similar elements or elements having the same or similar functions. Embodiments described below with reference to drawings are merely exemplary and used for explaining the present disclosure, and should not be understood as limitation to the present disclosure.

The present disclosure is related to an imaging method. An image sensor for imaging includes an array of photosensitive units, an array of filter units arranged on the array of photosensitive units, and an array of micro lenses arranged on the array of filter units. The array of photosensitive units includes focusing photosensitive units and non-focusing photosensitive units. The image sensor has a first output mode and a second output mode. The method includes: detecting a current ambient luminous intensity; when the current ambient luminous intensity is smaller than a preset intensity, controlling the image sensor to enter the first output mode; under the first output mode, controlling the array of photosensitive units to enter a focusing mode; obtaining output values of a part of photosensitive pixels in each focusing photosensitive unit as first output values; obtaining output values of another part of photosensitive pixels in each focusing photosensitive unit as second output values; performing focusing control according to the first output values and the second output values; under the first output mode, controlling the array of photosensitive units to enter an imaging mode; and controlling the array of photosensitive units to expose to generate an image under the first output mode.

The present disclosure is related to an image sensor. The image sensor includes: an array of photosensitive units; an array of filter units, arranged on the array of photosensitive units; and an array of micro lenses, arranged on the array of filter units. The array of photosensitive units includes focusing photosensitive units and non-focusing photosensitive units.

The present disclosure is related to an electronic device. The electronic device includes: an image sensor, a detecting module and a control module. The image sensor includes: an array of photosensitive units; an array of filter units, arranged on the array of photosensitive units; and an array of micro lenses, arranged on the array of filter units, in which, the array of photosensitive units includes focusing photosensitive units and non-focusing photosensitive units. The detecting module is configured to detect a current ambient luminous intensity. The control module is configured to: control the image sensor to enter the first output mode when the current ambient luminous intensity is smaller than a preset intensity; control, under the first output mode, the array of photosensitive units to enter a focusing mode; obtain output values of a part of photosensitive pixels in each focusing photosensitive unit as first output values; obtain output values of another part of photosensitive pixels in each focusing photosensitive unit as second output values; perform focusing control according to the first output values and the second output values; control, under the first output mode, the array of photosensitive units to enter an imaging mode; and control the array of photosensitive units to expose to generate an image under the first output mode.

The present disclosure is further related to an electronic device. The electronic device includes: a housing, a processor, a memory, a circuit board and a power supply circuit. The circuit board is arranged inside a space enclosed by the housing. The processor and the memory are arranged on the circuit board. The power supply circuit is configured to provide power for respective circuits or components of the mobile terminal. The memory is configured to store executable program codes. The processor is configured to run a program corresponding to the executable program codes by reading the executable program codes stored in the memory, to perform the above-mentioned imaging method.

The image sensor, the imaging method and the electronic device according to embodiments of the present disclosure will be described with reference to drawings.

FIG. 1 is a schematic diagram illustrating a three-dimensional structure according to an embodiment of the present disclosure.

As illustrated in FIG. 1, the image sensor 100 includes an array 10 of photosensitive units, an array 20 of filter units and an array 30 of micro lenses.

The array 20 of filter units is arranged on the array 10 of photosensitive units. The array 30 of micro lenses is arranged on the array 20 of filter units.

Figure 2:
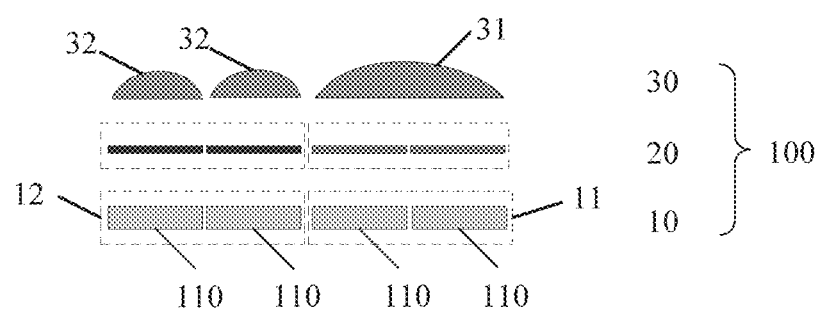
FIG. 2 is a section diagram illustrating an image sensor according to an embodiment of the present disclosure.

In at least one embodiment, as illustrated in FIG. 2, the array 10 of photosensitive units include focusing photosensitive units 11 and non-focusing photosensitive units 12. The array 30 of micro lenses includes first micro lenses 31 and second micro lenses 32. One first micro lens 31 covers one focusing photosensitive unit 11. N*N second micro lenses 32 cover one non-focusing photosensitive unit 12, where N is a positive integer. Both the focusing photosensitive unit 11 and the non-focusing photosensitive unit 12 include M*M photosensitive pixels 110, where M is a positive integer.

In at least one embodiment, a size of each of the first micro lenses 31 is different with that of each of the second micro lenses 32.

Figure 4:
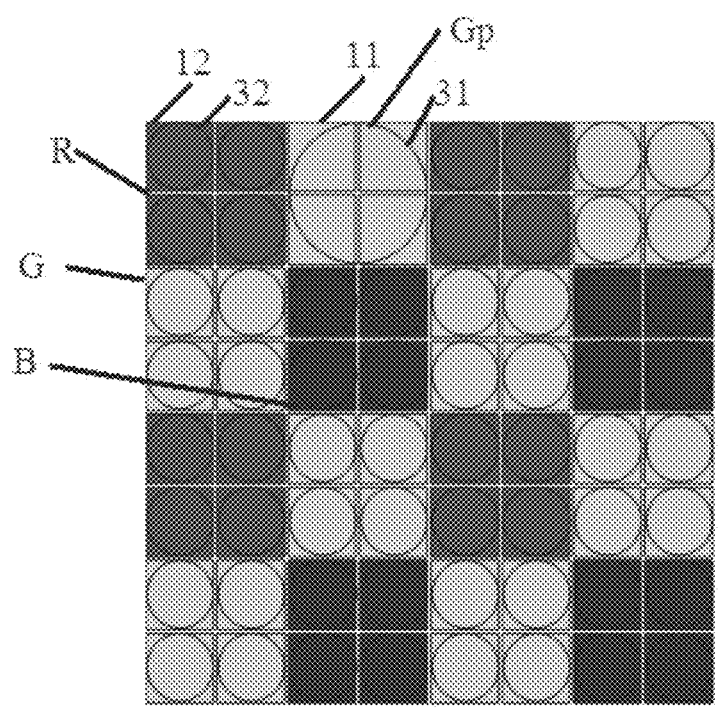
FIG. 4 is a top view when values of N and M are 2 according to an embodiment of the present disclosure.

In an embodiment of the present disclosure, values of M an N may be the same. For example, values of M an N are 2. As illustrated in FIG. 4, in the image sensor 100, 2*2 second micro lenses cover one non-focusing photosensitive unit, and both the focusing photosensitive unit and the non-focusing photosensitive unit include 2*2 photosensitive pixels. Certainly, the values of M an N may be different.

It should be noted that, in embodiments of the present disclosure, a shape of a micro lens may be a circle illustrated in FIG. 4, or may be a rectangle or other shapes.

Figure 3:
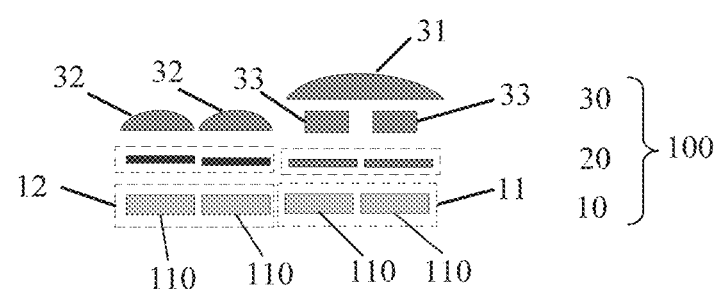
FIG. 3 is a section diagram illustrating an image sensor according to another embodiment of the present disclosure.

To make the focusing photosensitive units gather more light, in at least one embodiment of the present disclosure, one first micro lens in the array of micro lenses covers N*N rectangular micro lenses, where N is a positive integer. In an embodiment of the present disclosure, as illustrated in FIG. 3, one first micro lens of the image sensor covers 2*2 rectangular micro lenses 33.

That is, in this embodiment, the array 30 of micro lenses of the image sensor includes the first micro lenses 31, the second micro lenses 32 and the rectangular micro lenses 33. By covering the focusing photosensitive units with two kinds of micro lenses having a shape of two layers and having different sizes, it may make more light be gathered on the focusing photosensitive units, improving photographing effect and a focusing speed in a dark light environment.

The image sensor in embodiments of the present disclosure has two output modes, i.e., a first output mode and a second output mode.

Based on the structure of the image sensor illustrated above, an imaging method according to embodiments of the present disclosure will be described in the following.

Figure 5:
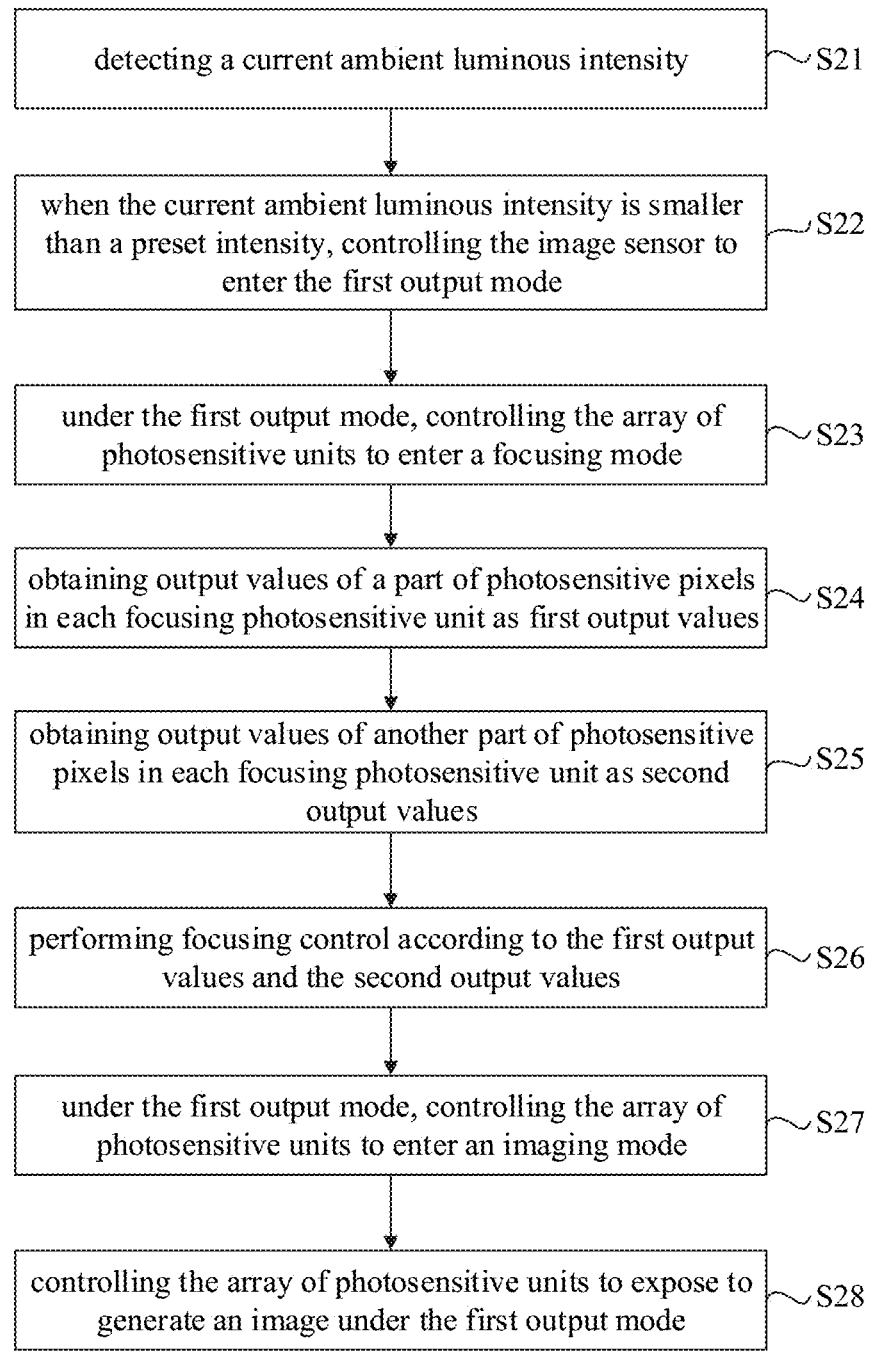
FIG. 5 is a flow chart of an imaging method according to an embodiment of the present disclosure.

As illustrated in FIG. 5, the imaging method of the image sensor includes the following.

At block 21, a current ambient luminous intensity is detected.

When an object is captured through a mobile phone, the current ambient luminous intensity is detected after a camera of the mobile phone is pointed to the object to be captured.

At block 22, when the current ambient luminous intensity is smaller than a preset intensity, the image sensor is controlled to enter the first output mode.

The detected current ambient luminous intensity is compared with the preset intensity. If the current ambient luminous intensity is smaller than the preset intensity (for example, 300 lux), i.e., the object to be captured may be in a dark light environment, the image sensor is controlled to enter the first output mode. The first output mode may be a 4M output format. In an image outputted under this format, colors of photosensitive pixels in the same photosensitive unit are the same. Therefore, a resolution is lower, but a signal-noise ratio is higher.

At block 23, under the first output mode, the array of photosensitive units is controlled to enter a focusing mode.

After the camera is pointed to the object to be captured, a screen may be clicked to focus. At this time, the array of photosensitive units enters the focusing mode under the first output mode.

At block 24, output values of a part of photosensitive pixels in each focusing photosensitive unit is obtained as first output values.

At block 25, output values of another part of photosensitive pixels in each focusing photosensitive unit is obtained as second output values.

At block 26, focusing control is performed according to the first output values and the second output values.

In the related art, in order to realize phase detection auto focus (PDAF for short), a photosensitive pixel structure (also called as masking pixels) that photosensitive pixels are adjacent to each other and arranged in pairs in the image sensor, is generally configured to divide light beams in various directions and directed to the masking pixels arranged in pairs into two parts, a left part and a right part for example. Since the structure of the masked pixels is more complex than a structure of ordinary photosensitive pixels, the masked pixels may be obtained by changing the structure of the ordinary photosensitive pixels or by separately adding a light blocking part based on the structure of the ordinary photosensitive pixels, such that a light beam in a certain direction in the light beams in various directions and directed to the masked pixels cannot reach to a photosensitive part of the masked pixels, and other light beams except the light beam in the certain direction may reach to the photosensitive part of the masked pixels. In other words, the masked pixels are generally arranged in pairs, adjacently and symmetrically. The masked pixels arranged in pairs are configured to separate light beams in various directions. A distance that a lens needs to be moved is calculated by comparing a phase difference (i.e., output of the masked pixels arranged in pairs) after imaging by light beams of the left part and light beams of the right part respectively.

While in embodiments of the present disclosure, by comparison of light signals in different directions, phase difference information between images may be obtained, further, distance information of the object to be captured is obtained according to the phase difference information, thus providing data foundation for phase focusing and depth of field information test. Apparently, in embodiments of the present disclosure, it can realize phase focusing test just by using a cooperating design of micro lens units, filter units and focusing photosensitive units, and it is not necessary to change the structure of the ordinary photosensitive pixels or to separately add the light blocking part based on the structure of the ordinary photosensitive pixels, thus implementation of the phase focusing test is more simple.

In the following, for example, each focusing photosensitive unit includes 2*2 photosensitive pixels, and a focusing control method under the first output mode will be described.

Figure 6:
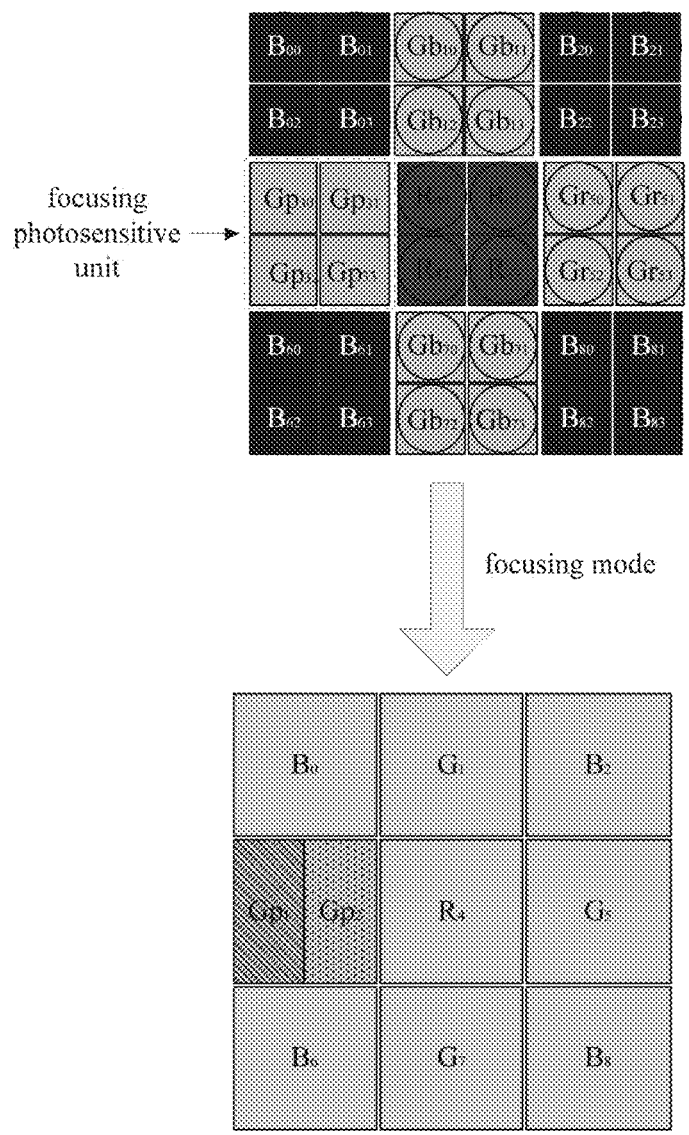
FIG. 6 is a schematic diagram illustrating performing focusing by dividing 2*2 photosensitive pixels in a focusing photosensitive unit into a left part and a right part according to an embodiment of the present disclosure.

For example, as illustrated in FIG. 6, output values $Gp_{30}$ and $Gp_{32}$ of two photosensitive pixels at left side in a focusing photosensitive unit are read as the first output values, and output values $Gp_{31}$ and $Gp_{33}$ of another part of photosensitive pixels, i.e., two photosensitive pixels at right side in the focusing photosensitive unit are read as the second output values.

After the first output values and the second output values are obtained, a sum of the output values $Gp_{30}$ and $Gp_{32}$ of the two photosensitive pixels at the left side in the focusing photosensitive unit is calculated, i.e., $Gp_1=Gp_{30}+Gp_{32}$, and a first phase value $Gp_1$ is generated. Similarly, a sum of the output values $Gp_{31}$ and $Gp_{33}$ of the two photosensitive pixels at the right side in the focusing photosensitive unit is calculated, i.e., $Gp_2=Gp_{31}+Gp_{33}$, and a second phase value $Gp_2$ is generated. Such that, phase difference information between $Gp_1$ and $Gp_2$ may be obtained, and then the phase difference information may be transformed to focus distance information, and a position of the lens is adjusted according to the focus distance information to realize the phase focusing, thus implementation of the phase focusing test is more simple.

Figure 7:
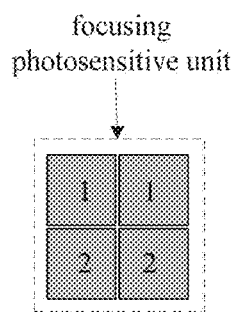
FIG. 7 is a schematic diagram illustrating performing focusing by dividing 2*2 photosensitive pixels in a focusing photosensitive unit into an upper part and a lower part according to an embodiment of the present disclosure.

In another embodiment of the present disclosure, as illustrated in FIG. 7, 2*2 photosensitive pixels in a focusing photosensitive unit are divided into an upper part and a lower part. Output values of two photosensitive pixels in the upper part of the focusing photosensitive unit are read as the first output values, and output values of two photosensitive pixels in the lower part of the focusing photosensitive unit are read as the second output values. After the first output values and the second output values are obtained, a first phase value is generated according to the first output values, and a second phase value is generated according to the second output values. And then, the focusing control is performed according to phase difference information between the first phase value and the second phase value.

Figure 8:
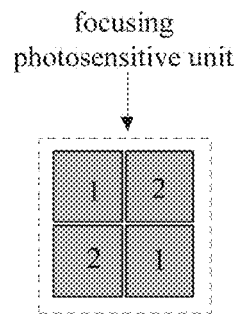
FIG. 8 is a schematic diagram illustrating performing focusing by dividing 2*2 photosensitive pixels in a focusing photosensitive unit into two parts by two diagonals of the focusing photosensitive unit according to an embodiment of the present disclosure.

In a further embodiment of the present disclosure, as illustrated in FIG. 8, 2*2 photosensitive pixels in a focusing photosensitive unit are divided into two parts by two diagonals of the focusing photosensitive unit. Output values of the photosensitive pixel at the top left corner and the photosensitive pixel at the lower right corner may be read as the first output values, and output values of the photosensitive pixel at the lower left corner and the photosensitive pixel at the top right corner may be read as the second output values. After the first output values and the second output values are obtained, a first phase value is generated according to the first output values, and a second phase value is generated according to the second output values. And then, the focusing control is performed according to phase difference information between the first phase value and the second phase value.

In embodiments of the present disclosure, by taking outputs of photosensitive pixels at the left and right sides of the 2*2 photosensitive pixels in a focusing photosensitive unit as the first output values and the second output values respectively, phase difference information in a left and right direction may be detected. By taking outputs of photosensitive pixels at the upper and lower parts of the 2*2 photosensitive pixels in a focusing photosensitive unit as the first output values and the second output values respectively, phase difference information in an up and down direction may be detected. By taking outputs of photosensitive pixels on the two diagonals of a focusing photosensitive unit as the first output values and the second output values respectively, phase difference information in a diagonal direction may be detected.

Figure 9:
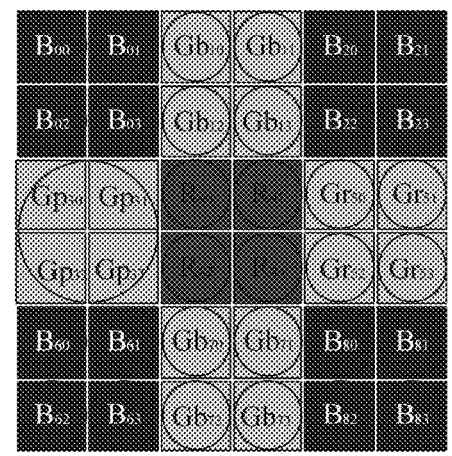
FIG. 9 is a schematic diagram illustrating performing focusing by dividing 2*2 photosensitive pixels in a focusing photosensitive unit into a left part and a right part according to another embodiment of the present disclosure.
Figure 9:
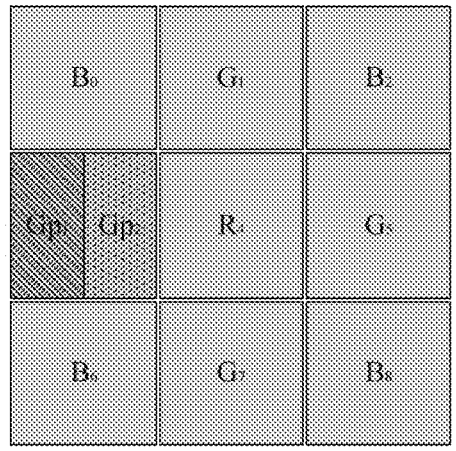

For another example, as illustrated in FIG. 9, output values $Gp_{30}$ and $Gp_{32}$ of two photosensitive pixels at left side in a focusing photosensitive unit are read as the first output values, and output values $Gp_{31}$ and $Gp_{33}$ of another part of photosensitive pixels, i.e., two photosensitive pixels at right side in the focusing photosensitive unit are read as the second output values.

After the first output values and the second output values are obtained, a sum of the output values $Gp_{30}$ and $Gp_{32}$ of the two photosensitive pixels at the left side in the focusing photosensitive unit is calculated, i.e., $Gp_1=Gp_{30}+Gp_{32}$, and a first phase value $Gp_1$ is generated. Similarly, a sum of the output values $Gp_{31}$ and $Gp_{33}$ of the two photosensitive pixels at the right side in the focusing photosensitive unit is calculated, i.e., $Gp_2=Gp_{31}+G_{P33}$, and a second phase value $Gp_2$ is generated. Such that, phase difference information between $Gp_1$ and $Gp_2$ may be obtained, and then the phase difference information may be transformed to focus distance information, and a position of the lens is adjusted according to the focus distance information to realize the phase focusing, thus implementation of the phase focusing test is more simple.

Figure 10:
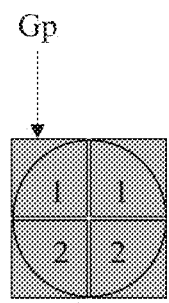
FIG. 10 is a schematic diagram illustrating performing focusing by dividing 2*2 photosensitive pixels in a focusing photosensitive unit into an upper part and a lower part according to another embodiment of the present disclosure.

In another embodiment of the present disclosure, as illustrated in FIG. 10, 2*2 photosensitive pixels in a focusing photosensitive unit are divided into an upper part and a lower part. Output values of two photosensitive pixels in the upper part of the focusing photosensitive unit are read as the first output values, and output values of two photosensitive pixels in the lower part of the focusing photosensitive unit are read as the second output values. After the first output values and the second output values are obtained, a first phase value is generated according to the first output values, and a second phase value is generated according to the second output values. And then, the focusing control is performed according to phase difference information between the first phase value and the second phase value.

Figure 11:
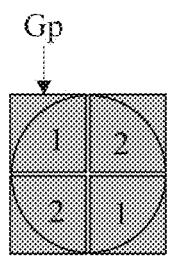
FIG. 11 is a schematic diagram illustrating performing focusing by dividing 2*2 photosensitive pixels in a focusing photosensitive unit into two parts by two diagonals of the focusing photosensitive unit according to another embodiment of the present disclosure.

In a further embodiment of the present disclosure, as illustrated in FIG. 11, 2*2 photosensitive pixels in a focusing photosensitive unit are divided into two parts by two diagonals of the focusing photosensitive unit. Output values of the photosensitive pixel at the top left corner and the photosensitive pixel at the lower right corner may be read as the first output values, and output values of the photosensitive pixel at the lower left corner and the photosensitive pixel at the top right corner may be read as the second output values. After the first output values and the second output values are obtained, a first phase value is generated according to the first output values, and a second phase value is generated according to the second output values. And then, the focusing control is performed according to phase difference information between the first phase value and the second phase value.

In embodiments of the present disclosure, by taking outputs of photosensitive pixels at the left and right sides of the 2*2 photosensitive pixels in a focusing photosensitive unit as the first output values and the second output values respectively, phase difference information in a left and right direction may be detected. By taking outputs of photosensitive pixels at the upper and lower parts of the 2*2 photosensitive pixels in a focusing photosensitive unit as the first output values and the second output values respectively, phase difference information in an up and down direction may be detected. By taking outputs of photosensitive pixels on the two diagonals of a focusing photosensitive unit as the first output values and the second output values respectively, phase difference information in a diagonal direction may be detected.

With the focusing control method of the image sensor under the first output mode according to embodiments of the present disclosure, by reading outputs of photosensitive pixels at different parts of the focusing photosensitive unit, phase information of incident light at different angles is obtained, detection of phase information corresponding to different directions is performed, improving a focusing speed in dark light, and making the focusing more accurate.

At block 27, under the first output mode, the array of photosensitive units is controlled to enter an imaging mode.

Under the first output mode, the array of photosensitive units is controlled to enter the imaging mode after the focusing control is completed according to the output values of the two parts of photosensitive pixels in each focusing photosensitive unit.

At block 28, the array of photosensitive units is controlled to expose to generate an image under the first output mode.

Figure 12:
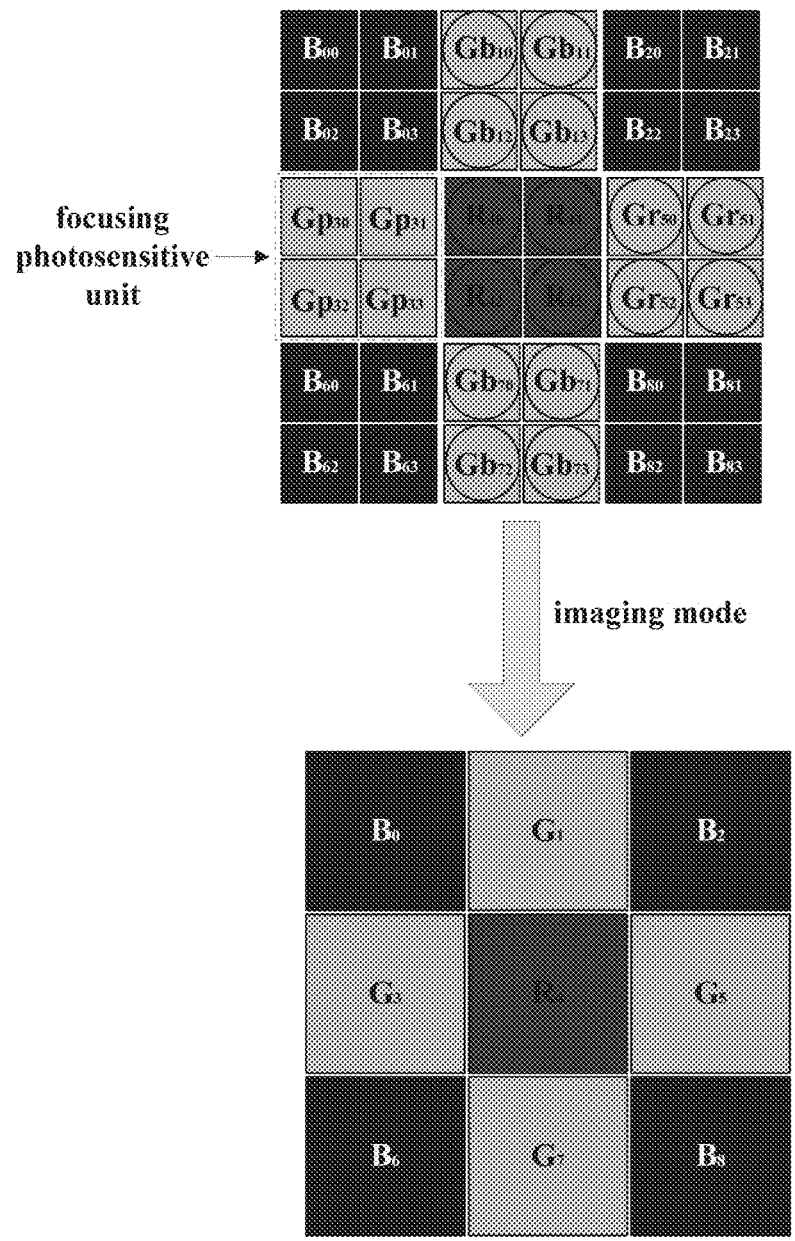
FIG. 12 is a schematic diagram illustrating imaging under a first output mode according to an embodiment of the present disclosure.

For example, as illustrated in FIG. 12, blue unit $B_0$, green unit $G_1$, green unit $G_3$, and red unit $R_4$ compose a Bayer RGB array. Exposure is performed on the focusing photosensitive units and the non-focusing photosensitive units. Output values $Gp_{30}$, $Gp_{31}$, $Gp_{32}$ and $Gp_{33}$ of the focusing photosensitive units and output values $B_{00}$, $B_{01}$, $B_{02}$, $B_{03}$, $Gb_{10}$, $Gb_{11}$, $Gb_{12}$, $Gb_{13}$ and the like of the non-focusing photosensitive units are read.

After reading the output values of the focusing photosensitive units and the non-focusing photosensitive units, output values $Gp_{30}$, $Gp_{31}$, $Gp_{32}$ and $Gp_{33}$ of 2*2 photosensitive pixels of the same focusing photosensitive unit are added to obtain a pixel value $G_3$ of the focusing photosensitive unit, i.e., $Gp_{30}+Gp_{31}+Gp_{32}+Gp_{33}=G_3$. Output values $B_{00}$, $B_{01}$, $B_{02}$ and $B_{03}$ of 2*2 photosensitive pixels of the same non-focusing photosensitive unit are added to obtain a pixel value $B_0$ of the non-focusing photosensitive unit, i.e., $B_{00}+B_{01}+B_{02}+B_{03}=B_0$. Similarly, pixel values of other non-focusing photosensitive unit may be obtained, such as a green pixel value $G_1=Gb_{10}+Gb_{11}+Gb_{12}+Gb_{13}$, a red pixel value $R_4=R_{40}+R_{41}+R_{42}+R_{43}$, and the like. The image under the first output mode is generated according to the pixel values of the focusing photosensitive units and the non-focusing photosensitive units.

Figure 13:
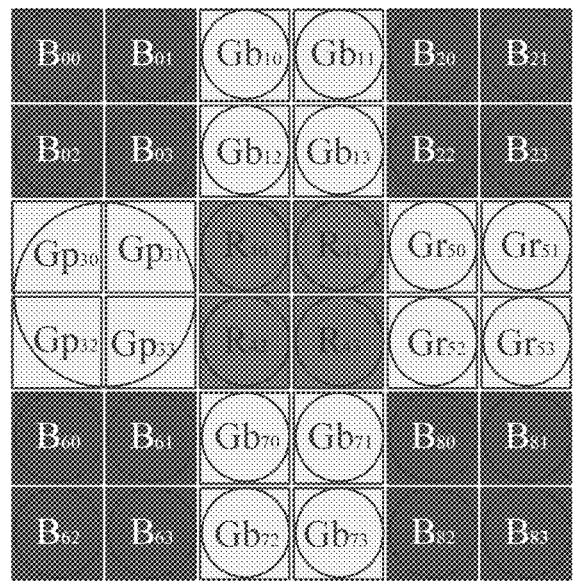
FIG. 13 is a schematic diagram illustrating imaging under a first output mode according to another embodiment of the present disclosure.
Figure 13:
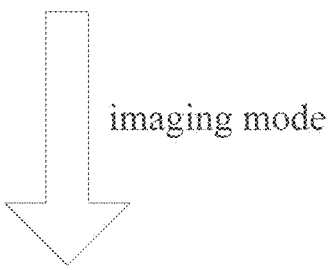
Figure 13:
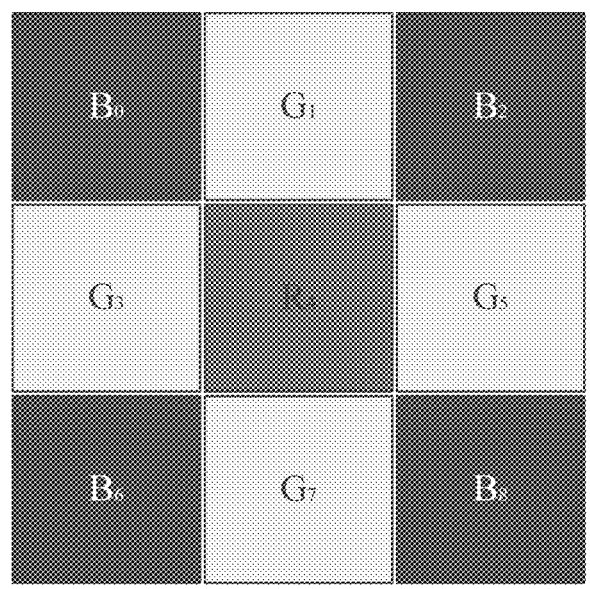

For another example, as illustrated in FIG. 13, blue unit $B_0$, green unit $G_1$, green unit $G_3$, and red unit $R_4$ compose a Bayer RGB array. Exposure is performed on the focusing photosensitive units and the non-focusing photosensitive units. Output values $Gp_{30}$, $Gp_{31}$, $Gp_{32}$ and $Gp_{33}$ of the focusing photosensitive units and output values $B_{00}$, $B_{01}$, $B_{02}$, $B_{03}$, $Gb_{10}$, $Gb_{11}$, $Gb_{1r}$, $Gb_{13}$ and the like of the non-focusing photosensitive units are read.

After reading the output values of the focusing photosensitive units and the non-focusing photosensitive units, output values $Gp_{30}$, $Gp_{31}$, $Gp_{32}$, and $Gp_{33}$ of 2*2 photosensitive pixels of the same focusing photosensitive unit are added to obtain a pixel value $G_3$ of the focusing photosensitive unit, i.e., $Gp_{30}+Gp_{31}+Gp_{32}+Gp_{33}=G_3$. Output values $B_{00}$, $B_{01}$, $B_{02}$, and $B_{03}$ of 2*2 photosensitive pixels of the same non-focusing photosensitive unit are added to obtain a pixel value $B_0$ of the non-focusing photosensitive unit, i.e., $B_{00}+B_{01}+B_{02}+B_{03}=B_0$. Similarly, pixel values of other non-focusing photosensitive unit may be obtained, such as a green pixel value $G_1=Gb_{10}+Gb_{11}+Gb_{12}+Gb_{13}$, a red pixel value $R_4=R_{40}+R_{41}+R_{42}+R_{43}$, and the like. The image under the first output mode is generated according to the pixel values of the focusing photosensitive units and the non-focusing photosensitive units.

With the imaging method according to embodiments of the present disclosure, a sum of output values of M*M photosensitive pixels of the photosensitive unit is taken as the pixel value of the photosensitive unit, and the image is generated according to the pixel values of the focusing photosensitive units and the non-focusing photosensitive units, thus effectively improving imaging sensitivity and a signal-noise ratio.

With the imaging method of the image sensor according to embodiments of the present disclosure, based on a structure that includes the array of photosensitive units, the array of filter units arranged on the array of photosensitive units and the array of micro lenses arranged on the array of filter units and in which the array of photosensitive units includes the focusing photosensitive units and the non-focusing photosensitive units, the image sensor has two output modes, i.e., the first output mode and the second output mode. When the current ambient luminous intensity is smaller than the preset intensity, the image sensor enters the first output mode, the focusing control is performed by using the output values of the part of photosensitive pixels in each focusing photosensitive unit and the output values of the another part of photosensitive pixels in each focusing photosensitive unit, such that it may effectively improve a focusing speed.

The above embodiments illustrate focusing methods and imaging methods when the image sensor enters the first output mode in a situation that the ambient luminous intensity is low. In the following, an imaging method under a bright light environment will be described in detail.

When an object is captured through a mobile phone, the current ambient luminous intensity is detected after a camera of the mobile phone is pointed to the object to be captured. The detected current ambient luminous intensity is compared with a preset intensity. If the current ambient luminous intensity is greater than the preset intensity (for example, 300 lux), i.e., the capturing environment is a bright light environment, the image sensor is controlled to enter the second output mode.

The second output mode may be a 16M output format. In an image outputted under this format, colors of photosensitive pixels in the same photosensitive unit are different. The image outputted under this format has more details than that outputted under the first output mode, with a higher resolution.

After the camera is pointed to the object to be captured, a screen may be clicked to focus. At this time, the array of photosensitive units enters a focusing mode.

In embodiments of the present disclosure, a focusing method under the second output mode is similar with the focusing method under the first output mode, which is not elaborated herein.

Figure 14:
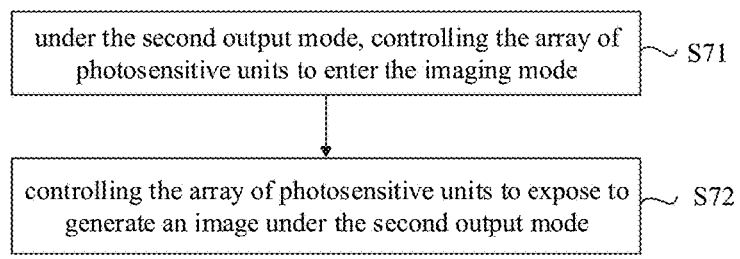
FIG. 14 is a flow chart of an imaging method of an imaging mode under a second output mode according to an embodiment of the present disclosure.

As illustrated in FIG. 14, the imaging method under the second output mode includes the following.

At block 71, under the second output mode, the array of photosensitive units is controlled to enter an imaging mode.

Under the second output mode, by obtaining phase difference information according to output values of two parts of photosensitive pixels in each focusing photosensitive unit, the array of photosensitive units is controlled to enter the imaging mode after the focusing control is completed according to the phase difference information.

At block 72, the array of photosensitive units is controlled to expose to generate an image under the second output mode.

In embodiments of the present disclosure, after the photosensitive units are controlled to enter the imaging mode, the exposure is performed on the array of photosensitive units. At the same time, output values of the array of photosensitive units are read.

After the output values of the array of photosensitive units are read, the pixel values of the array of photosensitive units may be obtained via an interpolation retrieving algorithm. And then the image is generated according to the pixel values of the array of photosensitive units after interpolation and retrieving.

In embodiments of the present disclosure, the interpolation retrieving algorithm may include the following.

Figure 15:
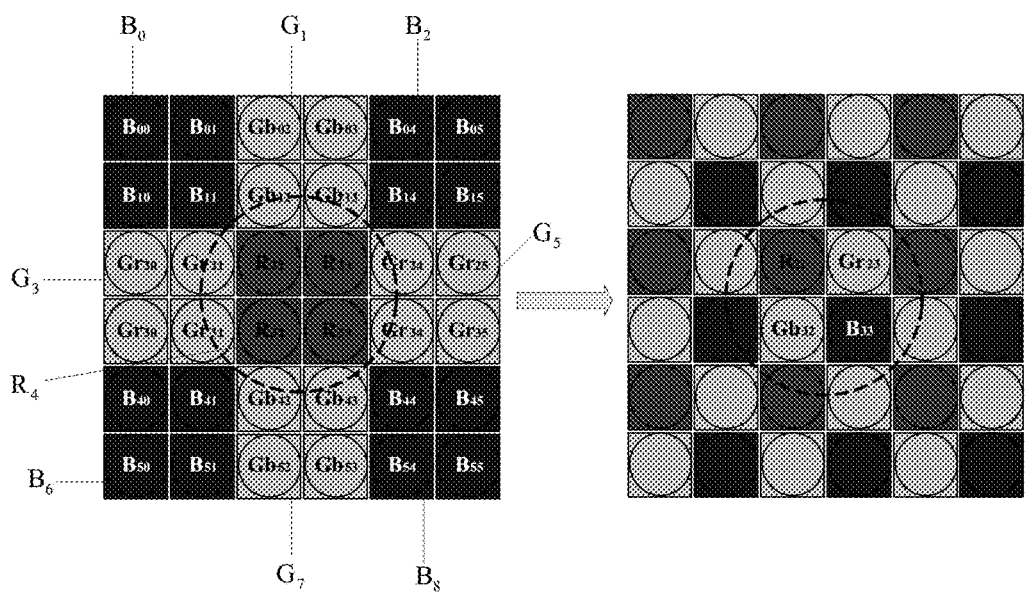
FIG. 15 is a schematic diagram illustrating performing interpolation retrieving on photosensitive units receiving red light according to an embodiment of the present disclosure.

It is determined whether a color of a current pixel is identical to that of an association pixel at a same position as the current pixel. As illustrated in FIG. 15, R22 in the right part image is the current pixel, and R22 in the left part image is the association pixel.

When the color of the current pixel is identical to that of the association pixel at the same position as the current pixel, a pixel value of the association pixel is determined as a pixel value of the current pixel. For example, as illustrated in FIG. 15, since a color of the current pixel R22 is red, which is identical to that of the association pixel at the same position as the current pixel, the pixel value of the current pixel and the pixel value of the association pixel at the same position as the current pixel are same, i.e., $R_{22}=R_{22}$.

When the color of the current pixel is different from that of the association pixel at the same position as the current pixel, the pixel value of the current pixel is determined according to the pixel value of the association pixel via an interpolation manner. An array of image pixel units includes association pixel units. The association pixel unit has a same color as the current pixel and is adjacent to the current pixel.

For example, as illustrated in FIG. 15, a color of current pixel $Gr_{23}$ is green, and a color of association pixel $R_{23}$ is red, that is, the color of the current pixel is different from that of the association pixel at the same position as the current pixel, a value of the current pixel $Gr_{23}$ may be calculated via the interpolation manner according to pixel values of association pixels. The association pixels of the current pixel $Gr_{23}$ are $G_1$, $G_3$, $G_5$, $G_7$.

In an embodiment of the present disclosure, the interpolation retrieving algorithm may be divided into two situations according to different colors of light received by the photosensitive units. Examples in detail are as follows.

In a first example, a photosensitive unit receives red light. As illustrated in FIG. 15, a color of current pixel $R_{22}$ is red, and a color of association pixel $R_{22}$ is also red, therefore, $R_{22}=R_{22}$. A color of current pixel $Gr_{23}$ is green, which is different from that of association pixel $R_{23}$, therefore, a value of current pixel $Gr_{23}$ may be obtained via the interpolation manner according to pixel values of association pixels $G_1$, $G_3$, $G_5$ and $G_7$, i.e. via formula (1).

$$Gr_{23} = \frac{2Gb_{13} + 2Gr_{24} + Gb_{03} + Gb_{12} + Gr_{21} + Gr_{25} + Gr_{34} + Gb_{43}}{10}. \quad \text{Formula (1)}$$

A color of current pixel $Gb_{32}$ is green, which is different from that of association pixel $R_{32}$. A value of current pixel $Gb_{32}$ may be obtained via the interpolation manner as formula (2) according to pixel values of association pixels $G_1$, $G_3$, $G_5$ and $G_7$.

$$Gb_{23} = \frac{2Gr_{31} + 2Gb_{42} + Gb_{12} + Gb_{21} + Gr_{30} + Gr_{34} + Gr_{43} + Gb_{52}}{10}. \quad \text{Formula (2)}$$

A color of current pixel $B_{33}$ is blue, which is different from that of association pixel $R_{33}$. A value of current pixel $B_{33}$ may be obtained via the interpolation manner according to pixel values of association pixels $B_0$, $B_2$, $B_6$ and $B_8$, i.e. via formula (3).

$$B_{33} = \frac{4B_{44} + B_{11} + B_{14} + B_{41} + B_{45} + B_{54}}{9}. \quad \text{Formula (3)}$$

It should be noted that, the interpolation retrieving algorithm of the photosensitive unit receiving blue light is same as that of the photosensitive unit receiving red light, which is not elaborated herein.

Figure 16:
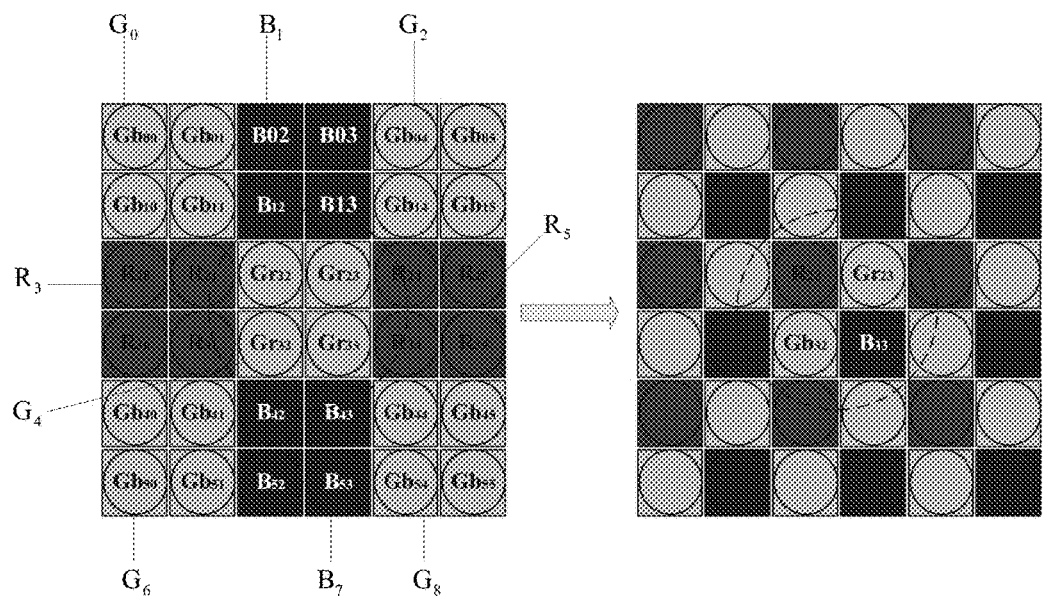
FIG. 16 is a schematic diagram illustrating performing interpolation retrieving on photosensitive units receiving green light according to an embodiment of the present disclosure.

In a second example, a photosensitive unit receives green light. As illustrated in FIG. 16, a color of current pixel $R_{22}$ is red, which is different from that of association pixel $Gr_{22}$. A value of the current pixel $R_{22}$ may be obtained via the interpolation retrieving according to pixel values of association pixels $R_3$ and $R_5$, i.e. via formula (4).

$$R_{22} = \frac{4R_{21} + R_{20} + R_{31} + R_{24}}{7}. \quad \text{Formula (4)}$$

It should be noted that, the interpolation retrieving algorithm of the photosensitive unit receiving blue light is same as that of the photosensitive unit receiving red light, which is not elaborated herein.

A color of current pixel $Gr_{23}$ is green, which is identical to that of association pixel $Gr_{23}$, then the value of the current pixel is same as the value of the association pixel, i.e., $Gr_{32}=Gr_{32}$. A color of current pixel $Gb_{32}$ is green, which is identical to that of association pixel, the value of the current pixel is same as the value of the association pixel, i.e., $Gb_{32}=Gb_{32}$. A color of current pixel $B_{33}$ is blue, which is different from that of association pixel $Gr_{33}$, a value of current pixel $B_{33}$ may be obtained via the interpolation retrieving according to pixel values of association pixels $B_1$ and $B_7$, i.e. via formula (5).

$$B_{33} = \frac{4B_{43} + B_{13} + B_{42} + B_{53}}{7}. \quad \text{Formula (5)}$$

After the pixel values of the array of photosensitive units are obtained according to the above-mentioned interpolation retrieving algorithm, the image under the second output mode is generated according to the pixel values of the array of photosensitive units.

With the imaging method provided in embodiments of the present disclosure, the image sensor may select a corresponding data output mode according to the current ambient luminous intensity, when the current ambient luminous intensity is smaller than the preset intensity, the image is generated according to the first output mode, and when the current ambient luminous intensity is greater than the preset intensity, the image is generated according to the second output mode.

With the imaging method of the image sensor according to embodiments of the present disclosure, based on a structure that includes the array of photosensitive units, the array of filter units arranged on the array of photosensitive units and the array of micro lenses arranged on the array of filter units and in which the array of photosensitive units includes the focusing photosensitive units and the non-focusing photosensitive units, the image sensor has two output modes, i.e., the first output mode and the second output mode. When the current ambient luminous intensity is smaller than the preset intensity, the image sensor enters the first output mode, the focusing control is performed by using the output values of the part of photosensitive pixels in each focusing photosensitive unit and the output values of the another part of photosensitive pixels in each focusing photosensitive unit, such that it may effectively improve a focusing speed.

When the values of M an N are the same, the focusing method and imaging method of the image sensor are similar to the focusing method and imaging method in the above-mentioned embodiments, which are not elaborated herein.

Certainly, the values of M an N may be different. When the values of M an N are different, the focusing method and imaging method of the image sensor are similar to the focusing method and imaging method in the above-mentioned embodiments, which are not elaborated herein.

Figure 17:
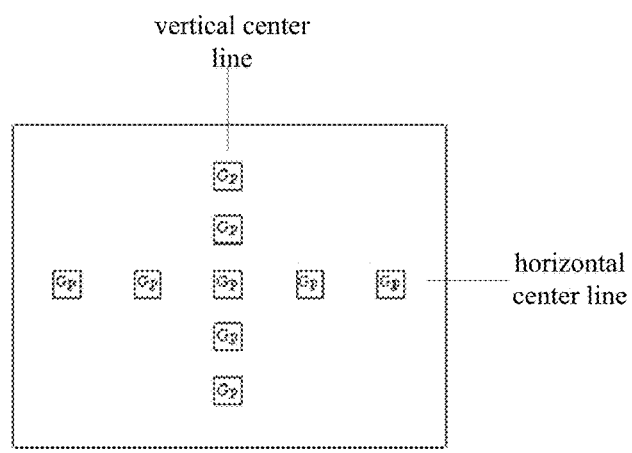
FIG. 17 is a schematic diagram illustrating distribution of focusing photosensitive units in an image sensor according to an embodiment of the present disclosure.

In an embodiment of the present disclosure, as illustrated in FIG. 17, the array of micro lenses may include a horizontal center line and a vertical center line. There are a plurality of first micro lenses. The plurality of first micro lenses includes a first group of first micro lenses arranged in the horizontal center line and a second group of first micro lenses arranged in the vertical center line.

Figure 18:
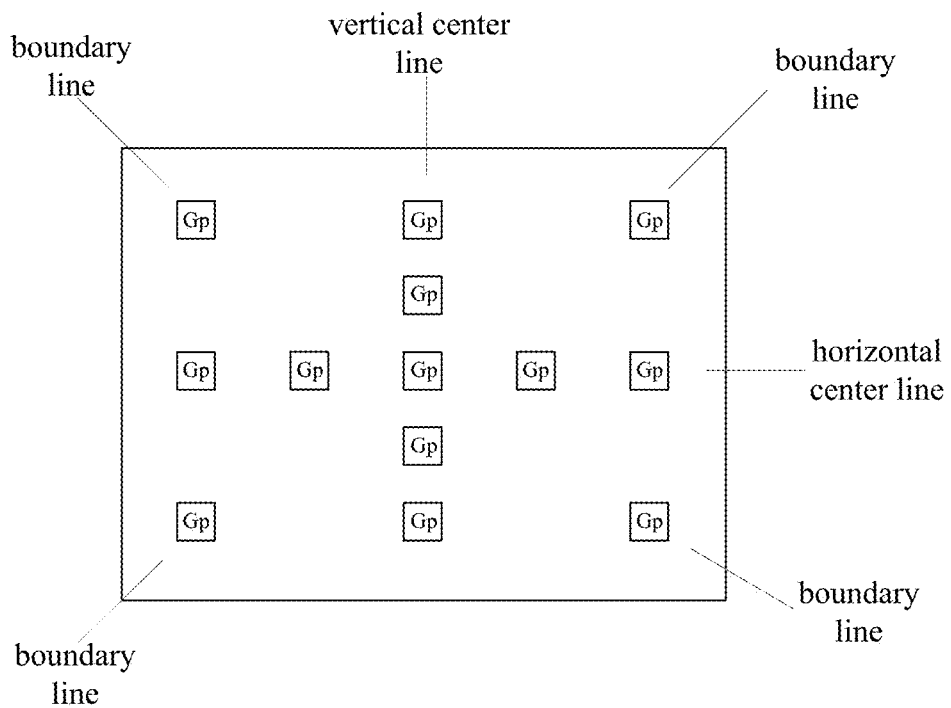
FIG. 18 is a schematic diagram illustrating distribution of focusing photosensitive units in an image sensor according to another embodiment of the present disclosure.

To improve a focusing speed, in another embodiment of the present disclosure, as illustrated in FIG. 18, the plurality of first micro lenses may further includes a third group of first micro lenses arranged in four boundary lines of the array of micro lenses.

It can be seen from FIG. 18 that, focusing photosensitive units, i.e., Gp in FIG. 18, covered by the first micro lenses distribute dispersedly in the image sensor, occupying 3%~5% of a total number of pixels. Gp distributes intensively in the central area of the image sensor, and distributes sparsely in the boundary areas. Phase information corresponding to the central area of the image is firstly obtained, thus effectively improving a focusing speed without affecting the quality of the image.

The greater density of a lens is and the greater a refractive index of the lens is, the stronger a concentration ability of the lens is. Therefore, in order to make more light be gathered on the focusing photosensitive units in the central area so as to improve the focusing speed and the photographing effect, in an embodiment of the present disclosure, densities of the first group of first micro lenses and the second group of first micro lenses may be greater than densities of the third group of first micro lenses, such that the amount of incident light of the focusing photosensitive units in the central area is greater than that of the focusing photosensitive units in the boundaries, thus improving the focusing speed and the photographing effect.

In an embodiment of the present disclosure, based on the distribution of the focusing photosensitive units illustrated in FIG. 18, when the image sensor is under the second output mode, values of photosensitive pixels of the focusing photosensitive units Gp may be processed.

Light in the central part of the image sensor is strong and is weak around. Therefore, values of photosensitive pixels in the focusing photosensitive units Gp in the central part of the image sensor may be directly used, and the further a focusing photosensitive unit Gp is from a central point of the image sensor, the lower reliability of values of photosensitive pixels in the focusing photosensitive unit Gp is, thus the values of photosensitive pixels in the focusing photosensitive units in boundaries of the image sensor may be replaced by values of around photosensitive pixels.

Figure 19:
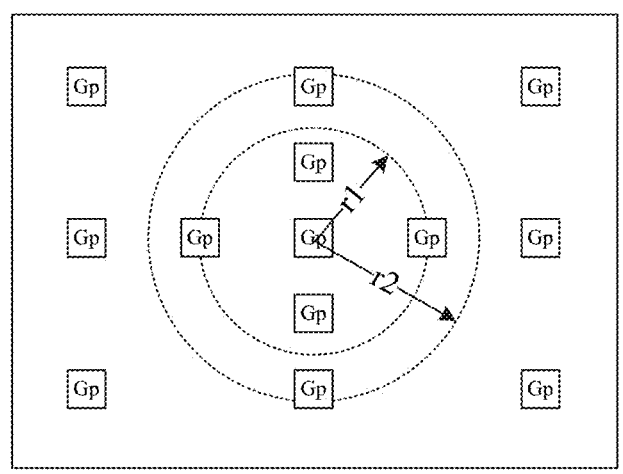
FIG. 19 is a schematic diagram illustrating a distance between focusing photosensitive unit Gp and a central point according to an embodiment of the present disclosure.
Figure 20:
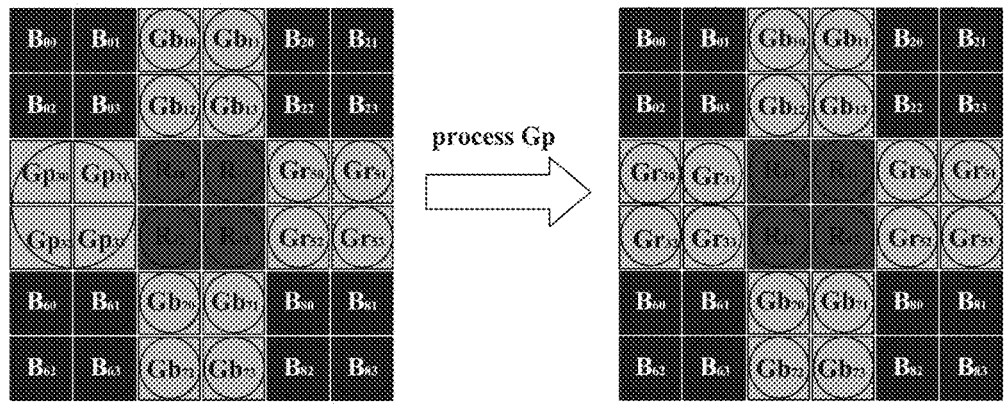
FIG. 20 is a schematic diagram illustrating processing focusing photosensitive unit Gp according to an embodiment of the present disclosure.

In an embodiment of the present disclosure, the values of photosensitive pixels of the focusing photosensitive units Gp may be processed according to a distance between each focusing photosensitive unit Gp and the central point of the image sensor. In an embodiment, as illustrated in FIG. 19, when a distance between a focusing photosensitive unit Gp and the central point of the image sensor is less than r1, i.e., the focusing photosensitive unit is in the central part of the image sensor, it may be considered that the values of photosensitive pixels in the focusing photosensitive unit Gp is equivalent to values of photosensitive pixels in a non-focusing photosensitive unit Gr. As illustrated in FIG. 20, $Gr_{30}=Gp_{30}$, $Gr_{31}=Gp_{31}$, $Gr_{32}=Gp_{32}$, $Gr_{33}=Gp_{33}$.

When a distance between a focusing photosensitive unit Gp and the central point of the image sensor is greater than r2, the values of photosensitive pixels in the focusing photosensitive unit Gp may be obtained by performing interpolation calculation on values of around photosensitive pixels.

When a distance between a focusing photosensitive unit Gp and the central point of the image sensor is greater than r1 and less than r2, the distance may be taken as a weight, and the values of photosensitive pixels in the focusing photosensitive unit may be obtained by performing weight average on pixel values of photosensitive pixels of the focusing photosensitive units having a distance less than r1 and pixel values of photosensitive pixels obtained by performing interpolation calculation which has a distance greater than r2.

After the phase information of the focusing photosensitive unit Gp is processed with the above-mentioned method, output values of the array of photosensitive units may be obtained. Pixel values of the array of photosensitive units may be obtained with an interpolation retrieving algorithm according to the output values of the array of photosensitive units. The interpolation retrieving algorithm is the same as the interpolation retrieving algorithm in the above-mentioned embodiments, which is not elaborated herein.

After the pixel values of the array of photosensitive units is obtained with the interpolation retrieving algorithm, the image under the second output mode may be generated according to the pixel values of the array of photosensitive units.

With the solutions provided in embodiments of the present disclosure, before performing the interpolation retrieving, the values of photosensitive pixels in the focusing photosensitive units are processed. Comparing with a solution in which phase information at the focusing photosensitive units is easily abandoned and is compensated with values of around pixels, with the solutions provided in embodiments of the present disclosure, sharpness and photographing effect of the image are improved.

To achieve above objectives, an electronic device according to embodiments of another aspect of the present disclosure will be described in the following. The electronic device can be an imaging apparatus or other electric apparatus with imaging function.

Figure 21:
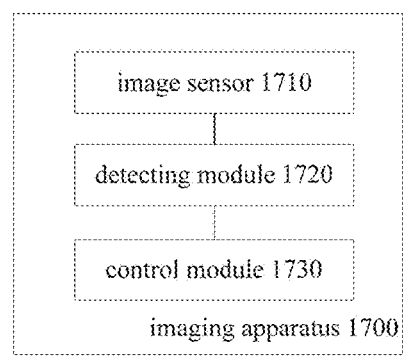
FIG. 21 is a block diagram of an imaging apparatus according to an embodiment of the present disclosure.

FIG. 21 is a block diagram of an imaging apparatus according to an embodiment of the present disclosure. As illustrated in FIG. 21, the image apparatus 1700 includes an image sensor 1710 of the above aspect of embodiments, a detecting module 1720 and a control module 1730.

The control module 1730 is configured to control the image sensor to enter the first output mode when the current ambient luminous intensity is smaller than a preset intensity. The control module 1730 is configured to control, under the first output mode, the array of photosensitive units to enter a focusing mode. The control module 1730 is configured to obtain output values of a part of photosensitive pixels in each focusing photosensitive unit as first output values. The control module 1730 is configured to obtain output values of another part of photosensitive pixels in each focusing photosensitive unit as second output values. The control module 1730 is configured to perform focusing control according to the first output values and the second output values. The control module 1730 is configured to control, under the first output mode, the array of photosensitive units to enter an imaging mode. The control module 1730 is configured to control the array of photosensitive units to expose to generate an image under the first output mode.

The control module 1730 is configured to generate a first phase value according to the first output values, to generate a second phase value according to the second output values, and to perform the focusing control according to the first phase value and the second phase value.

The control module 1730 is configured to control the focusing photosensitive units and the non-focusing photosensitive units to expose, and to obtain output values of the focusing photosensitive units and the non-focusing photosensitive units. The control module 1730 is configured to add output values of M*M photosensitive pixels of a same focusing photosensitive unit or adding output values of M*M photosensitive pixels of a same non-focusing photosensitive unit to obtain pixel values of the focusing photosensitive units and the non-focusing photosensitive units, so as to generate the image under the first output mode, where M is a positive integer.

The control module 1730 is further configured to control the image sensor to enter the second output mode when the current ambient luminous intensity is greater than the preset intensity. The control module 1730 is configured to control, under the second output mode, the array of photosensitive units to enter the focusing mode. The control module 1730 is configured to obtain output values of the part of photosensitive pixels in each focusing photosensitive unit as third output values. The control module 1730 is configured to obtain output values of the another part of photosensitive pixels in each focusing photosensitive unit as fourth output values. The control module 1730 is configured to perform focusing control according to the third output values and the fourth output values. The control module 1730 is configured to control, under the second output mode, the array of photosensitive units to enter the imaging mode. The control module 1730 is configured to control the array of photosensitive units to expose to generate an image under the second output mode.

The control module 1730 is configured to control the array of photosensitive units to expose, and to obtain output values of the array of photosensitive units to obtain pixel values of the array of photosensitive units so as to generate the image under the second output mode. The pixel values of the array of photosensitive units are obtained via an interpolation retrieving algorithm.

The control module 1730 is configured to determine whether a color of a current pixel is identical to that of an association pixel at a same position as the current pixel. The control module 1730 is configured to, when the color of the current pixel is identical to that of the association pixel at the same position as the current pixel, determine a pixel value of the association pixel as a pixel value of the current pixel. The control module 1730 is configured to, when the color of the current pixel is different from that of the association pixel at the same position as the current pixel, determine the pixel value of the current pixel according to a pixel value of the association pixel based on an interpolation algorithm. The array of photosensitive units includes association pixel units, each association pixel unit has the same color as the current pixel and is adjacent to the current pixel.

With the imaging apparatus according to embodiments of the present disclosure, based on a structure that includes the array of photosensitive units, the array of filter units arranged on the array of photosensitive units and the array of micro lenses arranged on the array of filter units, and in which the array of photosensitive units includes the focusing photosensitive units and the non-focusing photosensitive units, the image sensor has two output modes, i.e., the first output mode and a the second output mode. When the current ambient luminous intensity is smaller than the preset intensity, the image sensor enters the first output mode, the focusing control is performed by using the output values of the part of photosensitive pixels in each focusing photosensitive unit and the output values of the another part of photosensitive pixels in each focusing photosensitive unit, such that it may effectively improve a focusing speed.

Embodiments of another aspect of the present disclosure further provide an electronic device.

Figure 22:
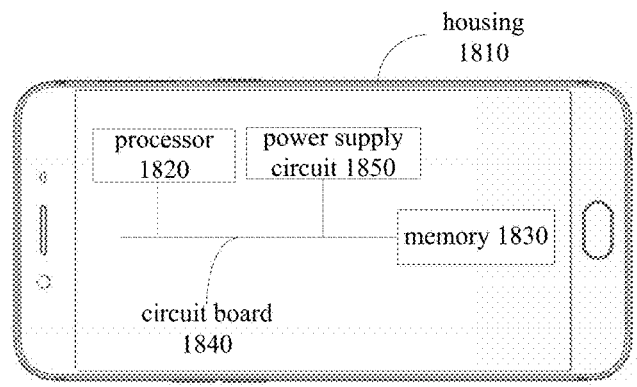
FIG. 22 is a structure diagram of an electronic device according to an embodiment of the present disclosure.

As illustrated in FIG. 22, the electronic device includes a housing 1810, a processor 1820, a memory 1830, a circuit board 1840 and a power supply circuit 1850. The circuit board 1840 is arranged inside a space enclosed by the housing 1810. The processor 1820 and the memory 1830 are arranged on the circuit board 1840. The power supply circuit 1850 is configured to provide power for respective circuits or components of the electronic device. The memory 1830 is configured to store executable program codes. The processor 1820 is configured to run a program corresponding to the executable program codes by reading the executable program codes stored in the memory 1830, to perform the imaging method of the image sensor according to embodiments of the above aspect of the present disclosure.

With the electronic device according to embodiments of the present disclosure, based on a structure that includes the array of photosensitive units, the array of filter units arranged on the array of photosensitive units and the array of micro lenses arranged on the array of filter units, and in which the array of photosensitive units includes the focusing photosensitive units and the non-focusing photosensitive units, the image sensor has two output modes, i.e., the first output mode and the second output mode. When the current ambient luminous intensity is smaller than the preset intensity, the image sensor enters the first output mode, the focusing control is performed by using the output values of the part of photosensitive pixels in each focusing photosensitive unit and the output values of the another part of photosensitive pixels in each focusing photosensitive unit, such that it may effectively improve a focusing speed.

It should be noted that relationship terms such as first and second are only used herein to distinguish an entity or operation from another entity or operation, and it is not necessarily required or implied that there are any actual relationship or order of this kind between those entities and operations. Moreover, terms such as "comprise", "comprising" and any other variants are intended to cover non-exclusive contains, so that the processes, methods, articles or devices including a series of elements not only include those elements but also include other elements that are not listed definitely, or also include the elements inherent in the processes, methods, articles or devices. In the case of no more restrictions, the elements defined by the statement 'comprise one . . . ' do not exclude that other same elements also exist in the processes, methods, articles or devices including the elements.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of acquiring the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer-readable medium comprise but are not limited to: an electronic connection (an electronic device) with one or more wires, a portable computer enclosure (a magnetic device), a random access memory (RAM), a read-only memory (ROM), an erasable programmable read-only memory (EPROM or a flash memory), an optical fiber device and a portable compact disk read-only memory (CDROM). In addition, the computer-readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples. Moreover, those skilled in the art could combine different embodiments or different characteristics in embodiments or examples described in the present disclosure.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. An imaging method, comprising:
   detecting a current ambient luminous intensity;
   when the current ambient luminous intensity is smaller than a preset intensity, controlling an image sensor to enter a first output mode, wherein the image sensor has the first output mode and a second output mode, the image sensor comprises an array of photosensitive units, an array of filter units arranged on the array of photosensitive units, and an array of micro lenses arranged on the array of filter units, the array of photosensitive units comprises focusing photosensitive units and non-focusing photosensitive units;
   under the first output mode, controlling the array of photosensitive units to enter a focusing mode;
   obtaining output values of a part of photosensitive pixels in each focusing photosensitive unit as first output values;
   obtaining output values of another part of photosensitive pixels in each focusing photosensitive unit as second output values;
   performing focusing control according to the first output values and the second output values;
   under the first output mode, controlling the array of photosensitive units to enter an imaging mode; and
   controlling the array of photosensitive units to expose to generate an image under the first output mode.

2. The method according to claim 1, wherein performing the focusing control according to the first output values and the second output values comprises:
   generating a first phase value according to the first output values;
   generating a second phase value according to the second output values; and
   performing the focusing control according to the first phase value and the second phase value.

3. The method according to claim 1, wherein each of the focusing photosensitive units and each of the non-focusing photosensitive units both comprise M×M photosensitive pixels, controlling the array of photosensitive units to expose to generate the image under the first output mode comprises:
   controlling the focusing photosensitive units and the non-focusing photosensitive units to expose, and obtaining output values of the focusing photosensitive units and the non-focusing photosensitive units; and
   adding output values of M×M photosensitive pixels of a same focusing photosensitive unit and adding output values of M×M photosensitive pixels of a same non-focusing photosensitive unit to obtain pixel values of the focusing photosensitive units and the non-focusing photosensitive units, so as to generate the image under the first output mode, where M is a positive integer greater than or equal to 2.

4. The method according to claim 1, further comprising:
   when the current ambient luminous intensity is greater than the preset intensity, controlling the image sensor to enter the second output mode;
   under the second output mode, controlling the array of photosensitive units to enter the focusing mode;
   obtaining output values of the part of photosensitive pixels in each focusing photosensitive unit as third output values;
   obtaining output values of the another part of photosensitive pixels in each focusing photosensitive unit as fourth output values;
   performing the focusing control according to the third output values and the fourth output values;
   under the second output mode, controlling the array of photosensitive units to enter the imaging mode; and
   controlling the array of photosensitive units to expose to generate an image under the second output mode.

5. The method according to claim 4, wherein controlling the array of photosensitive units to expose to generate the image under the second output mode comprises:
   controlling the array of photosensitive units to expose, and obtaining output values of the array of photosensitive units to obtain pixel values of the array of photosensitive units so as to generate the image under the second output mode, wherein the pixel values of the array of photosensitive units are obtained via an interpolation retrieving algorithm.

6. The method according to claim 5, wherein obtaining the pixel values of the array of photosensitive units via the interpolation retrieving algorithm comprises:
   determining whether a color of a current pixel is identical to that of an association pixel at a same position as the current pixel;
   when the color of the current pixel is identical to that of the association pixel at the same position as the current pixel, determining a pixel value of the association pixel as a pixel value of the current pixel; and
   when the color of the current pixel is different from that of the association pixel at the same position as the current pixel, determining the pixel value of the current pixel according to a pixel value of the association pixel based on an interpolation algorithm, wherein the array of photosensitive units comprises association pixel units, each association pixel unit has the same color as the current pixel and is adjacent to the current pixel.

7. An image sensor, comprising:
an array of photosensitive units;
an array of filter units, arranged on the array of photosensitive units; and
an array of micro lenses, arranged on the array of filter units;
wherein, the array of photosensitive units comprises focusing photosensitive units and non-focusing photosensitive units;
the array of micro lenses comprises first micro lenses and second micro lenses, one first micro lens covers one focusing photosensitive unit, N×N second micro lenses cover one non-focusing photosensitive unit, where N is a positive integer greater than or equal to 2; and the array of micro lenses further comprises third micro lenses, one first micro lens covers N×N third micro lenses, and the N×N third micro lenses covers one focusing photosensitive unit.

8. The method according to claim 7, wherein a shape of each of the first micro lens is different with that of each of the third micro lens.

9. The image sensor according to claim 7, wherein
a first group of first micro lenses is arranged along a horizontal center line of the image sensor; and
a second group of first micro lenses is arranged along a vertical center line of the image sensor.

10. The image sensor according to claim 9, wherein a third group of first micro lenses is arranged along four boundary lines.

11. The image sensor according to claim 10, wherein densities of the first group of first micro lenses and the second group of first micro lenses are greater than densities of the third group of first micro lenses.

12. The image sensor according to claim 7, wherein each of the focusing photosensitive units and each of the non-focusing photosensitive units comprise M×M photosensitive pixels, where M is a positive integer greater than or equal to 2.

13. An electronic device, comprising:
an image sensor, comprising:
an array of photosensitive units;
an array of filter units, arranged on the array of photosensitive units; and
an array of micro lenses, arranged on the array of filter units, wherein, the array of photosensitive units comprises focusing photosensitive units and non-focusing photosensitive units;
a detector, configured to detect a current ambient luminous intensity; and
a controller, configured to:
control the image sensor to enter the first output mode when the current ambient luminous intensity is smaller than a preset intensity;
control, under the first output mode, the array of photosensitive units to enter a focusing mode;
obtain output values of a part of photosensitive pixels in each focusing photosensitive unit as first output values;
obtain output values of another part of photosensitive pixels in each focusing photosensitive unit as second output values;
perform focusing control according to the first output values and the second output values;
control, under the first output mode, the array of photosensitive units to enter an imaging mode; and
control the array of photosensitive units to expose to generate an image under the first output mode.

14. The electronic device according to claim 13, wherein the controller is configured to:
generate a first phase value according to the first output values;
generate a second phase value according to the second output values; and
perform the focusing control according to the first phase value and the second phase value.

15. The electronic device according to claim 13, wherein the controller is configured to:
control the focusing photosensitive units and the non-focusing photosensitive units to expose, and obtain output values of the focusing photosensitive units and the non-focusing photosensitive units; and
add output values of M×M photosensitive pixels of a same focusing photosensitive unit and adding output values of M×M photosensitive pixels of a same non-focusing photosensitive unit to obtain pixel values of the focusing photosensitive units and the non-focusing photosensitive units, so as to generate the image under the first output mode, where M is a positive integer greater than or equal to 2.

16. The electronic device according to claim 13, wherein the controller is further configured to:
when the current ambient luminous intensity is greater than the preset intensity, control the image sensor to enter the second output mode;
under the second output mode, control the array of photosensitive units to enter the focusing mode;
obtain output values of the part of photosensitive pixels in each focusing photosensitive unit as third output values;
obtain output values of the another part of photosensitive pixels in each focusing photosensitive unit as fourth output values;
perform the focusing control according to the third output values and the fourth output values;
under the second output mode, control the array of photosensitive units to enter the imaging mode; and
control the array of photosensitive units to expose to generate an image under the second output mode.

17. The electronic device according to claim 13, wherein the controller is configured to:
control the array of photosensitive units to expose, and obtain output values of the array of photosensitive units to obtain pixel values of the array of photosensitive units so as to generate the image under the second output mode, wherein the pixel values of the array of photosensitive units are obtained via an interpolation retrieving algorithm.

18. The electronic device according to claim 17, wherein the controller is configured to:
determine whether a color of a current pixel is identical to that of an association pixel at a same position as the current pixel;
when the color of the current pixel is identical to that of the association pixel at the same position as the current pixel, determine a pixel value of the association pixel as a pixel value of the current pixel; and
when the color of the current pixel is different from that of the association pixel at the same position as the current pixel, determine the pixel value of the current pixel according to a pixel value of the association pixel based on an interpolation algorithm, wherein the array of photosensitive units comprises association pixel units, each association pixel unit has the same color as the current pixel and is adjacent to the current pixel.

* * * * *